United States Patent
Chung

(10) Patent No.: US 7,285,987 B2
(45) Date of Patent: Oct. 23, 2007

(54) SELF DC-BIAS HIGH FREQUENCY LOGIC GATE, HIGH FREQUENCY NAND GATE AND HIGH FREQUENCY NOR GATE

(75) Inventor: Yuan-Hung Chung, Hsinchu County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 97 days.

(21) Appl. No.: 11/160,877

(22) Filed: Jul. 14, 2005

(65) Prior Publication Data

US 2006/0197557 A1 Sep. 7, 2006

(30) Foreign Application Priority Data

Mar. 7, 2005 (TW) .............................. 94106744 A

(51) Int. Cl.
*H03K 5/22* (2006.01)
(52) U.S. Cl. .................. 327/65; 327/108; 327/563; 326/30; 326/104
(58) Field of Classification Search ............... 326/104, 326/30; 327/108
See application file for complete search history.

(56) References Cited

U.S. PATENT DOCUMENTS

| | | | |
|---|---|---|---|
| 6,137,309 A | 10/2000 | Couteaux et al. ............. 326/55 |
| 6,340,899 B1 * | 1/2002 | Green .......................... 326/115 |
| 6,392,486 B1 * | 5/2002 | Lemay, Jr. ................... 330/253 |
| 6,750,681 B2 | 6/2004 | Wei .............................. 326/127 |
| 7,061,279 B1 * | 6/2006 | Leete ............................ 327/65 |
| 2001/0048342 A1 * | 12/2001 | Yoshida et al. ............. 327/552 |

* cited by examiner

*Primary Examiner*—Vibol Tan
(74) *Attorney, Agent, or Firm*—Jianq Chyun IP Office

(57) ABSTRACT

A self DC-bias high frequency logic gate is disclosed. The logic gate comprises at least one input terminal and one output terminal for performing Boolean operation on the high frequency input signals. The logic gate is characterized in that each transistor is coupled to an impedance matching network. The impedance matching network comprises a first terminal and a second terminal. Wherein, the first terminal is coupled to a gate of the transistor, and the second terminal is coupled to a drain of the transistor for providing an operation voltage to the transistor. When a gate of an N-type transistor and a gate of a P-type transistor are coupled with each other, and a drain of the N-type transistor and a drain of the P-type transistor are also coupled with each other, a common impedance matching network is shared with both the N-type transistor and the P-type transistor.

20 Claims, 6 Drawing Sheets

US 7,285,987 B2

SELF DC-BIAS HIGH FREQUENCY LOGIC GATE, HIGH FREQUENCY NAND GATE AND HIGH FREQUENCY NOR GATE

CROSS-REFERENCE TO RELATED APPLICATION

This application claims the priority benefit of Taiwan application serial no. 94106744, filed on Mar. 7, 2005. All disclosure of the Taiwan application is incorporated herein by reference.

BACKGROUND OF THE INVENTION

1. Field of the Invention

The present invention relates to a configuration of a digital logic gate, and more particularly, to a high frequency logic gate.

2. Description of the Related Art

Along with continuous progress of electronic technique, it is the trend that digital system designs are to be faster, thinner and lighter. However, in order to have the logic gate operated normally, a higher input signal has to be fed into the conventional logic gate. Therefore, the conventional logic gate cannot be normally operated in the RF (Radio Frequency) band when the signals are very weak (e.g. 0.9-1.1V).

A logic gate using in the RF band had been proposed in the field. FIG. 1 schematically shows a configuration of a current-mode logic AND gate. Referring to FIG. 1, the configuration comprises the inputs A, −A, B, −B, the outputs C and −C, the transistors M1, M2, M3, and M4, the resistors R1 and R2, and a current source I. Wherein, the resistors R1 and R2 comprise a first terminal and a second terminal respectively, and the current source I comprises a first terminal and a second terminal. Input A is fed into a gate of the transistor M1. A source of the transistor M1 is electrically coupled to the first terminal of the current source I, a drain of the transistor M1 is electrically coupled to the output −C, which is also electrically coupled to the first terminal of the resistor R1 and a drain of the transistor M3. The input −A is fed into a gate of the transistor M2. A source of the transistor M2 is electrically coupled to the first terminal of the current source I, and a drain of the transistor M2 is electrically coupled to a source of the transistor M3 and a source of the transistor M4. Input B is fed into a gate of the transistor M3, and input −B is fed into a gate of the transistor M4. A drain of the transistor M4 is electrically coupled to the output C, which is electrically coupled to the first terminal of the resistor R2. The second terminals of the resistors R1 and R2 are electrically coupled to a voltage source Vdd, and a second terminal of the current source I is grounded. Wherein, inputs A and −A, B and −B are the reverse phase logic inputs, and outputs C and −C are the reverse phase logic outputs.

In the configuration, transistors M1 and M2 are the differential inputs of A and −A, and transistors M3 and M4 are the differential inputs of B and −B. Since the amplitude of the input voltage signal in RF band is very small, the transistors M1, M2, M3, and M4 are not completely turned off or turned on. Therefore, the transistors M1, M2, M3, and M4 are functionally equivalent to a differential amplifier, and the current source I is used as a bias current for obtaining the output signals C and −C. The configuration mentioned above is referred to as the conventional current mode logic. Although such configuration is operated well in the RF band in which the amplitude of the input voltage signal is very small, since the transistors M3 and M4 are electrically coupled to the transistor M2, such that the inputs B and −B must have one more DC level than the inputs A and −A. And the differential input pairs of A and −A, B and −B are not symmetric. In addition, a constant current is required for normal operation, thus there is DC-bias consumption even when the logic gate is idle. Currently, the portable electronic products are widely accepted, and the power consumption issue has become an essential criterion in the design of the IC (Integrated Circuit) chip, thus it is no doubt that the DC-bias consumption is a significant source of the power consumption. Therefore, it is important to design a high frequency logic gate capable of significantly reducing the power consumption.

SUMMARY OF THE INVENTION

Therefore, it is an object of the present invention to provide a self DC-bias high frequency logic gate for performing a high speed logic operation in an RF band with very weak signals.

It is another object of the present invention to provide a high frequency Boolean operation NAND gate for performing a high speed logic operation with symmetric inputs.

It is yet another object of the present invention to provide a high frequency Boolean operation NOR gate for performing a high speed logic operation, and the NOR gate significantly saves the electric power when the NOR gate is idle.

The present invention provides a self DC-bias high frequency logic gate. The self DC-bias high frequency logic gate comprises at least one input terminal and one output terminal for performing a Boolean operation on the high frequency input signals. The logic gate is characterized in that each transistor is electrically coupled to an impedance matching network; and the impedance matching network comprises a first terminal and a second terminal, wherein the first terminal is electrically coupled to a gate of the transistor, and the second terminal is electrically coupled to a drain of the transistor for providing the transistor with an operation voltage. In addition, when a gate of an N type transistor and a gate of a P type transistor are electrically coupled with each other, and a drain of the N type transistor and a drain of the P type transistor are also electrically coupled with each other, a common impedance matching network is shared with both the N type transistor and the P type transistor.

In the self DC-bias high frequency logic gate according to a preferred embodiment of the present invention, the impedance matching network mentioned above is a low pass network. With the low pass network, the high frequency signals between the gate and the drain of the transistor are not interfered with each other while the DC-bias is normally provided.

In the self DC-bias high frequency logic gate according to the preferred embodiment of the present invention, the self DC-bias high frequency logic gate mentioned above is operated in the RF band with very weak signals.

The present invention further provides a high frequency NAND gate, the NAND gate comprises a first input terminal, a second input terminal and an output terminal. The NAND gate further comprises a first capacitor, a second capacitor, a third capacitor, a fourth capacitor, a first transistor, a second transistor, a third transistor, a fourth transistor, a fifth transistor, a sixth transistor, a first impedance matching network, a second impedance matching network, a third impedance matching network, and a fourth impedance matching network. Wherein, the first terminal of the first capacitor is electrically coupled to the first input terminal for isolating the DC component in a signal input into the first input terminal. The first terminal of the second capacitor is electrically coupled to the second input terminal for isolating the DC component in a signal input into the second input terminal. The gate of the first transistor is electrically coupled to the second terminal of the first capacitor, and the drain of the first transistor is electrically coupled to the output terminal. The gate of the second transistor is electrically coupled to the second terminal of the second capacitor, and the drain of the second transistor is electrically coupled to the output terminal. The first terminal of the third capacitor is electrically coupled to the gate of the first transistor. The first terminal of the fourth capacitor is electrically coupled to the gate of the second transistor. The gate of the third transistor is electrically coupled to the second terminal of the fourth capacitor, the source of the third transistor is grounded, and the drain of the third transistor is electrically coupled to the source of the first transistor. The gate of the fourth transistor is electrically coupled to the second terminal of the third capacitor, the source of the fourth transistor is grounded, and the drain of the fourth transistor is electrically coupled to the source of the second transistor. The source of the fifth transistor is electrically coupled to the voltage source, the gate of the fifth transistor is electrically coupled to the second terminal of the first capacitor, and the drain of the fifth transistor is electrically coupled to the output terminal. The source of the sixth transistor is electrically coupled to the voltage source, the gate of the sixth transistor is electrically coupled to the second terminal of the second capacitor, and the drain of the sixth transistor is electrically coupled to the output terminal. The first terminal of the first impedance matching network is electrically coupled to the second terminal of the first capacitor, and its second terminal is electrically coupled to the output terminal for providing an operation voltage to the first transistor and the fifth transistor. The first terminal of the second impedance matching network is electrically coupled to the second terminal of the second capacitor, and its second terminal is electrically coupled to the output terminal for providing an operation voltage to the second transistor and the sixth transistor. The first terminal of the third impedance matching network is electrically coupled to the drain of the third transistor, and its second terminal is electrically coupled to the gate of the third transistor for providing an operation voltage to the third transistor. The first terminal of the fourth impedance matching network is electrically coupled to the drain of the fourth transistor, and its second terminal is electrically coupled to the gate of the fourth transistor for providing an operation voltage to the fourth transistor. The configuration mentioned above is to perform an NAND Boolean operation on the high frequency signals and output an operation result.

In the high frequency NAND gate according to the preferred embodiment of the present invention, the first, second, third and fourth transistors mentioned above are N type MOSFET (Metal-Oxide-Semiconductor Field Effect Transistor), and the fifth and sixth transistors are P type MOSFET.

In the high frequency NAND gate according to the preferred embodiment of the present invention, the first and second impedance matching networks are a low pass network, respectively. With the low pass network, the high frequency signals between the gate and the drain of the transistor are not interfered with each other while the DC-bias is normally provided.

The present invention further provides a high frequency NOR gate, the NOR gate comprises a first input terminal, a second input terminal, and an output terminal. The NOR gate further comprises a first capacitor, a second capacitor, a third capacitor, a fourth capacitor, a first transistor, a second transistor, a third transistor, a fourth transistor, a fifth transistor, a sixth transistor, a first impedance matching network, a second impedance matching network, a third impedance matching network, and a fourth impedance matching network. Wherein, the first terminal of the first capacitor is electrically coupled to the first input terminal for isolating the DC component in the first input terminal signal. The first terminal of the second capacitor is electrically coupled to the second input terminal for isolating the DC component in the second input terminal signal. The gate of the first transistor is electrically coupled to the second terminal of the first capacitor, and the drain of the first transistor is electrically coupled to the output terminal. The gate of the second transistor is electrically coupled to the second terminal of the second capacitor, and the drain of the second transistor is electrically coupled to the output terminal. The first terminal of the third capacitor is electrically coupled to the gate of the first transistor. The first terminal of the fourth capacitor is electrically coupled to the gate of the second transistor. The gate of the third transistor is electrically coupled to the second terminal of the fourth capacitor, the source of the third transistor is electrically coupled to the voltage source, and the drain of the third transistor is electrically coupled to the source of the first transistor. The gate of the fourth transistor is electrically coupled to the second terminal of the third capacitor, the source of the fourth transistor is electrically coupled to the voltage source, and the drain of the fourth transistor is electrically coupled to the source of the second transistor. The source of the fifth transistor is grounded, the gate of the fifth transistor is electrically coupled to the second terminal of the first capacitor, and the drain of the fifth transistor is electrically coupled to the output terminal. The source of the sixth transistor is grounded, the gate of the sixth transistor is electrically coupled to the second terminal of the second capacitor, and the drain of the sixth transistor is electrically coupled to the output terminal. The first terminal of the first impedance matching network is electrically coupled to the second terminal of the first capacitor, and its second terminal is electrically coupled to the output terminal for providing an operation voltage to the first transistor and the fifth transistor. The first terminal of the second impedance matching network is electrically coupled to the second terminal of the second capacitor, and its second terminal is electrically coupled to the output terminal for providing an operation voltage to the second transistor and the sixth transistor. The first terminal of the third impedance matching network is electrically coupled to the drain of the third transistor, and its second terminal is electrically coupled to the gate of the third transistor for providing an operation voltage to the third transistor. The first terminal of the fourth impedance matching network is electrically coupled to the drain of the fourth transistor, and its second terminal is electrically coupled to the gate of the fourth transistor for providing an operation voltage to the fourth transistor. This function is to perform an NOR Boolean operation on the high frequency signals and output an operation result.

In the high frequency NOR gate according to the preferred embodiment of the present invention, the first, second, third and fourth transistors mentioned above are P type MOSFET (Metal-Oxide-Semiconductor Field Effect Transistor), and the fifth and sixth transistors are N type MOSFET.

In the high frequency NOR gate according to the preferred embodiment of the present invention, the first and second impedance matching networks are a low pass network, respectively. With the low pass network, the high frequency signals between the gate and the drain of the transistor are not interfered with each other while the DC-bias is normally provided.

The present invention uses the impedance matching network configuration to provide a self DC-bias, such that the present invention can be operated in the RF band with very weak signals. In addition, the high frequency signals between the gate and the drain of the transistor are not interfered with each other while the DC-bias is normally provided. Further, the electric power will not be wasted when the logic gate is idle.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

Figure 1:
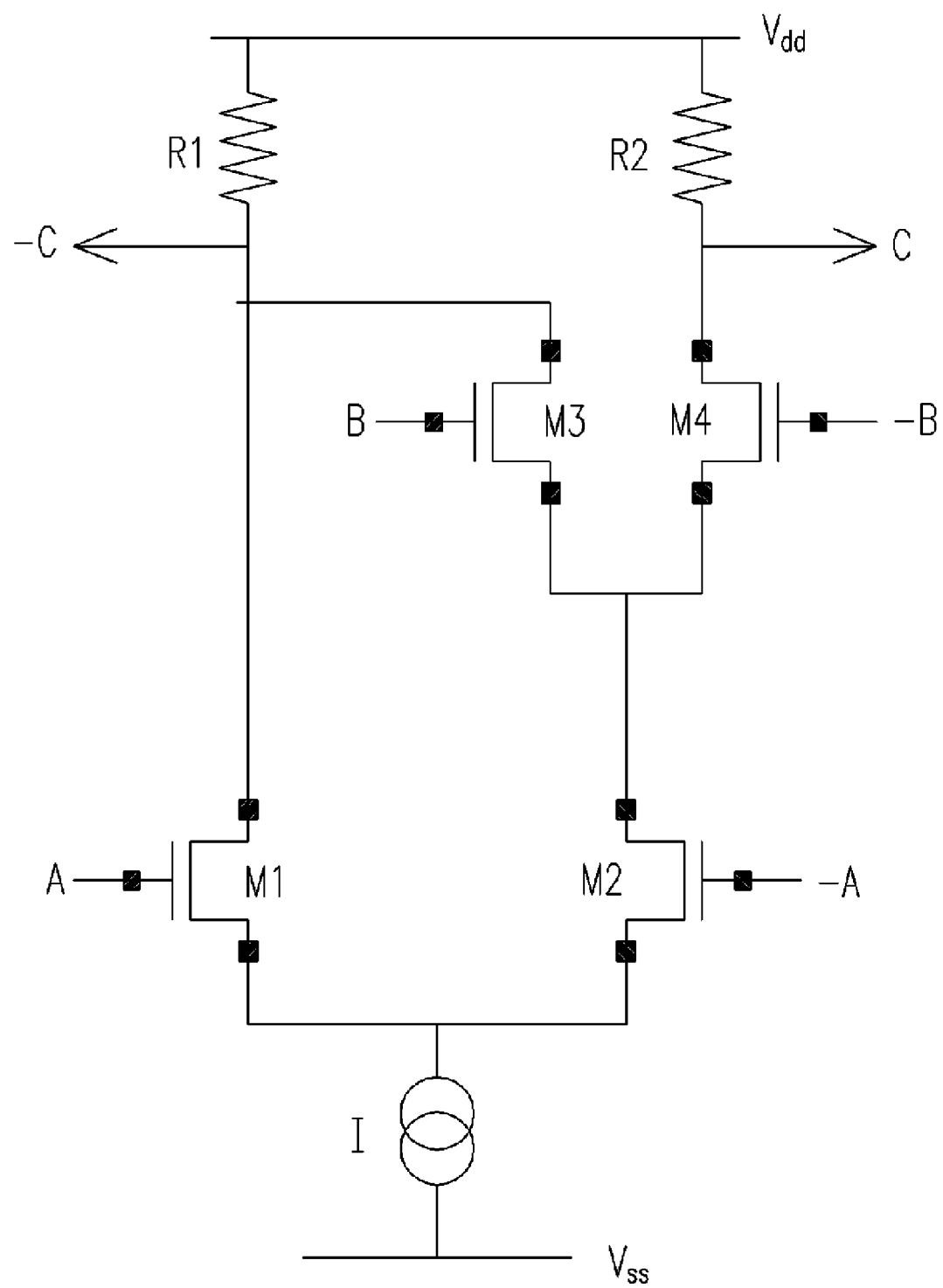
FIG. 1 schematically shows a circuit diagram of a conventional high frequency current mode NAND gate.
Figure 2:
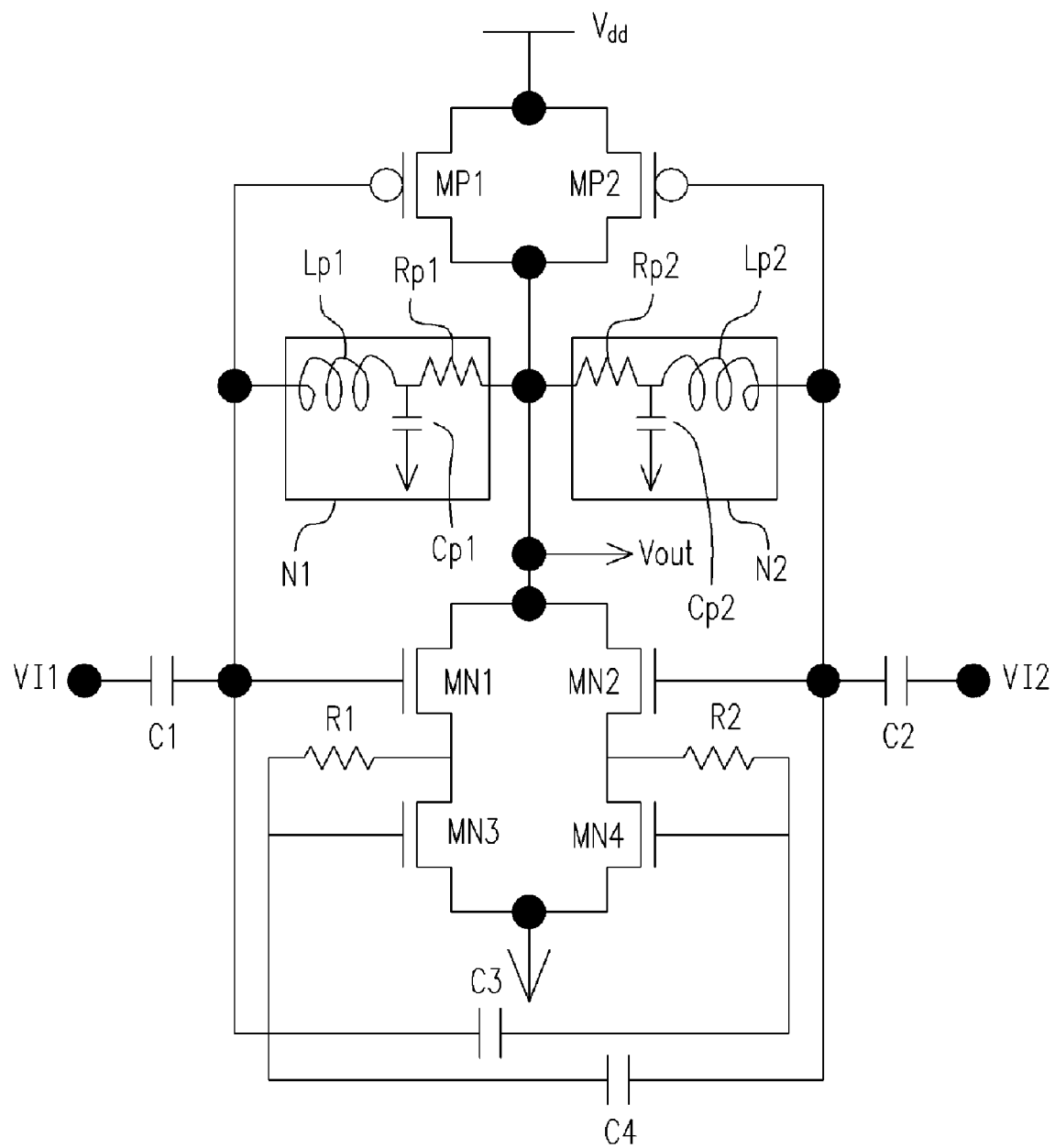
FIG. 2 schematically shows a circuit diagram of a high frequency NAND gate according to a preferred embodiment of the present invention.

FIG. 2 schematically shows a high frequency NAND gate according to a preferred embodiment of the present invention using in the RF band with very weak signals. Referring to FIG. 2, the NAND gate comprises a first input terminal VI1, a second input terminal VI2, and an output terminal Vout for performing an NAND Boolean operation on the high frequency input signals and generating an operation result. The NAND gate further comprises the N type MOSFETs MN1, MN2, MN3, and MN4, the P type MOSFETs MP1 and MP2, the capacitors C1, C2, C3, and C4, the resistors R1 and R2, and the impedance matching networks N1 and N2. Wherein, the impedance matching network N1 comprises a matching inductance element Lp1, a matching capacitance element Cp1 and a matching resistance element Rp1. The first terminal of the matching inductance element Lp1 is the first terminal of the impedance matching network N1. The first terminal of the matching capacitance element Cp1 is electrically coupled to the second terminal of the matching inductance element Lp1, and its second terminal is grounded. The first terminal of the matching resistance element Rp1 is electrically coupled to the second terminal of the inductance element Lp1, and its second terminal is electrically coupled to the second terminal of the impedance matching network N1. Similarly, the impedance matching network N2 comprises a matching inductance element Lp2, a matching capacitance element Cp2 and a matching resistance element Rp2. The first terminal of the matching inductance element Lp2 is the first terminal of the impedance matching network N2. The first terminal of the matching capacitance element Cp2 is electrically coupled to the second terminal of the matching inductance element Lp2, and its second terminal is grounded. The first terminal of the matching resistance element Rp2 is electrically coupled to the second terminal of the inductance element Lp2, and its second terminal is electrically coupled to the second terminal of the impedance matching network N2. It will be apparent to one of the ordinary skill in the art that the positions of the matching inductance element Lp1 and the matching resistance element Rp1 may be swapped with each other. Similarly, the positions of the matching inductance element Lp2 and the matching resistance element Rp2 may be swapped with each other, too.

The first terminal of the capacitor C1 is electrically coupled to the first input terminal VI1, and the first terminal of the capacitor C2 is the second input terminal VI2. The gate of the transistor MN1 is electrically coupled to the second terminal of the capacitor C1, and the drain of the transistor MN1 is electrically coupled to the output terminal Vout. The gate of the transistor MN2 is electrically coupled to the second terminal of the capacitor C2, and the drain of the transistor MN2 is electrically coupled to the output terminal Vout. The gate of the transistor MN3 is electrically coupled to the second terminal of the capacitor C4, the source of the transistor MN3 is grounded, and the drain of the transistor MN3 is electrically coupled to the source of the transistor MN1. The first terminal of the capacitor C4 is electrically coupled to the second terminal of the capacitor C2. The gate of the transistor MN4 is electrically coupled to the second terminal of the capacitor C3, the source of the transistor MN4 is grounded, and the drain of the transistor MN4 is electrically coupled to the source of the transistor MN2. The first terminal of the capacitor C3 is electrically coupled to the second terminal of the capacitor C1. The first terminal of the resistor R1 is electrically coupled to the drain of the transistor MN3, and its second terminal is electrically coupled to the gate of the transistor MN3. The first terminal of the resistor R2 is electrically coupled to the drain of the transistor MN4, and its second terminal is electrically coupled to the gate of the transistor MN4. The source of the transistor MP1 is electrically coupled to the voltage source Vdd, the gate of the transistor MP1 is electrically coupled to the second terminal of the capacitor C1, and the drain of the transistor MP1 is electrically coupled to the output terminal Vout. The source of the transistor MP2 is electrically coupled to the voltage source Vdd, the gate of the transistor MP2 is electrically coupled to the second terminal of the capacitor C2, and the drain of the transistor MP2 is electrically coupled to the output terminal Vout. The first terminal of the impedance matching network N1 is electrically coupled to the second terminal of the capacitor C1, and its second terminal is electrically coupled to the output terminal Vout. The first terminal of the impedance matching network N2 is electrically coupled to the second terminal of the capacitor C2, and its second terminal is electrically coupled to the output terminal Vout.

The main function of the capacitors C1 and C2 is to eliminate a DC component in the input signals VI1 and VI2. Since the DC component in the input signals had been blocked, a DC-bias is required in order to normally supply the input signals. The main function of the impedance matching networks N1 and N2 is to guide the DC-bias from the transistors MP1 and MP2 to the output terminal, wherein the DC component of the input signal had been blocked, through the impedance matching networks N1 and N2, and the input signal terminals are the second terminals of the capacitors C1 and C2. This is the so-called self supplied DC-bias, and is also known as self DC-bias or self bias. Since transistors MN3 and MN4 are on the low side of the transistors MN1 and MN2, the DC-bias for driving the gate of the transistors MN3 and MN4 is different from the DC-bias for driving the gate of the transistors MN1 and MN2. Therefore, the DC-bias originally provided to the transistors MN1 and MN2 is blocked by the capacitors C3 and C4, and a new DC-bias is provided to the gate of the transistors MN3 and MN4 through a path constituted by the resistors R1 and R2, respectively. When the impedance matching networks N1 and N2 are used as a DC-bias path, since both terminals are electrically coupled to the input terminals VI1, VI2, and the output terminal Vout respectively, the output terminal may be impacted by the input terminal signal, and/or the input terminal may be impacted by the output terminal signal. Therefore, the circuit of the impedance matching networks N1 and N2 is configured as an LRC (Inductance-Resistance-Capacitance) low pass network, such that the input high frequency is blocked by the impedance matching networks N1 and N2 and cannot impact the output Vout. In addition, the output Vout is also blocked by the impedance matching networks N1 and N2, thus the inputs VI1 and VI2 are not impacted by it. Furthermore, since this configuration is operated in high frequency, the signal is usually very weak. As a result, the signal may be reflected and attenuated, and is not able to be transmitted with full-power. With the impedance matching networks N1 and N2, the impedance matching is achieved, and thus the signal can be input with full-power transfer.

Referring to FIG. 2, here the N type MOSFETs MN1, MN2, MN3, and MN4 and the P type MOSFETs MP1 and MP2 are not served as a switch. Instead, they work as a differential amplifier. When the signals of logic 1 are fed into the inputs VI1 and VI2, respectively (here the signal is weak and roughly equal to the amplitude of LVDS logic level), meanwhile since the transistors MP1 and MP2 have received the signals of logic 1, the voltages Vgs between the gate and the source of the transistors MP1 and MP2 are reduced, and the current output from the voltage source Vdd is also reduced. Meanwhile, the transistors MN1 and MN4 have received the signals of logic 1 (the signal is weak and roughly equal to the amplitude of LVDS logic level), such that the voltages Vgs between the gate and the source of the transistors MN1 and MN4 are increased, and the turn-on scales for the transistors MN1 and MN4 are also increased. Similarly, the transistors MN2 and MN3 have received the signals of logic 1 (the signal is weak and roughly equal to the amplitude of LVDS logic level). Meanwhile, since the voltages Vgs between the gate and the source of the transistors MN2 and MN3 have been increased, the turn-on scales for the transistors MN1 and MN4 are increased. On the other hand, since the turn-on scales for the transistors MP1 and MP2 have been reduced, the supplied current is reduced, and the turn-on scales for the transistors MN1, MN2, MN3, and MN4 are also increased, which pulls down Vout to the level of logic 0.

Similarly, when the input VI1 is logic 1, and the input VI2 is logic 0 (the signal is weak and roughly equal to the amplitude of LVDS logic level), meanwhile the transistor MP1 has received a signal of logic 1, such that the voltage Vgs between the gate and the source of the transistor MP1 is reduced, and the current provided by the voltage source Vdd flowing through the transistor MP1 is reduced. However, meanwhile the transistor MP2 has received a signal of logic 0, such that the voltage Vgs between the gate and the source of the transistors MP2 is increased, and the current provided by the voltage source Vdd flowing through the transistor MP2 is increased. The transistors MN1 and MN4 have received the signals of logic 1, such that the voltages Vgs between the gate and the source of the transistors MN1 and MN4 are increased, and the turn-on scales for the transistors MN1 and MN4 are also increased. Since the transistors MN2 and MN3 have received the signals of logic 0, the voltages Vgs between the gate and the source of the transistors MN2 and MN3 are reduced, and the turn-on scales for the transistors MN2 and MN3 are increased. On the other hand, since the turn-on scale for the transistor MP1 has been reduced, the turn-on scale for the transistor MP2 is increased, such that the supplied current is not changed. In addition, the turn-on scales for the transistors MN1 and MN4 have been increased, and the turn-on scales for the transistors MN2 and MN3 have been reduced, such that the capability of pulling down the current is reduced. Therefore, the output Vout is pulled up to logic 1. Alternatively, in a case where the input VI1 is logic 0, and the input VI2 is logic 1, the role play of transistors MN2 and MN3 is swapped with the transistors MN1 and MN4, and the role play of the transistor MP1 is swapped with the transistor MP2. The operation mode of such case is the same as the one mentioned above, and the outcome is the same, thus its detail is omitted herein.

In addition, when both the inputs VI1 and VI2 are in the logic 0 weak potential, meanwhile, since the voltages Vgs between the gate and the source of the transistors MN1, MN2, MN3, and MN4 are reduced, the pulled down current is also reduced. Whereas, the voltages Vgs between the gate and the source of the transistors MP1 and MP2 are increased, such that the current provided by the voltage source Vdd flowing through the transistors MP1 and MP2 is also increased, and the output is pulled up to logic 1.

Referring to FIG. 2, when there is no signal fed into the input terminals VI1 and VI2, a DC-bias provided by the voltage source Vdd flowing through the transistors MP1 and MP2 is fed into the transistors MN1 and MP1 via the impedance matching circuit N1. Similarly, a DC-bias is provided to the transistors MN2 and MP2 through the impedance matching network N2, and the voltage Vgs is reduced by the DC-bias received by the transistors MP2 and MP1, thus the supplied DC-bias is reduced and the DC current flowing to the ground is also reduced. With such configuration, the static power consumption is reduced when the logic gate is idle.

Figure 3:
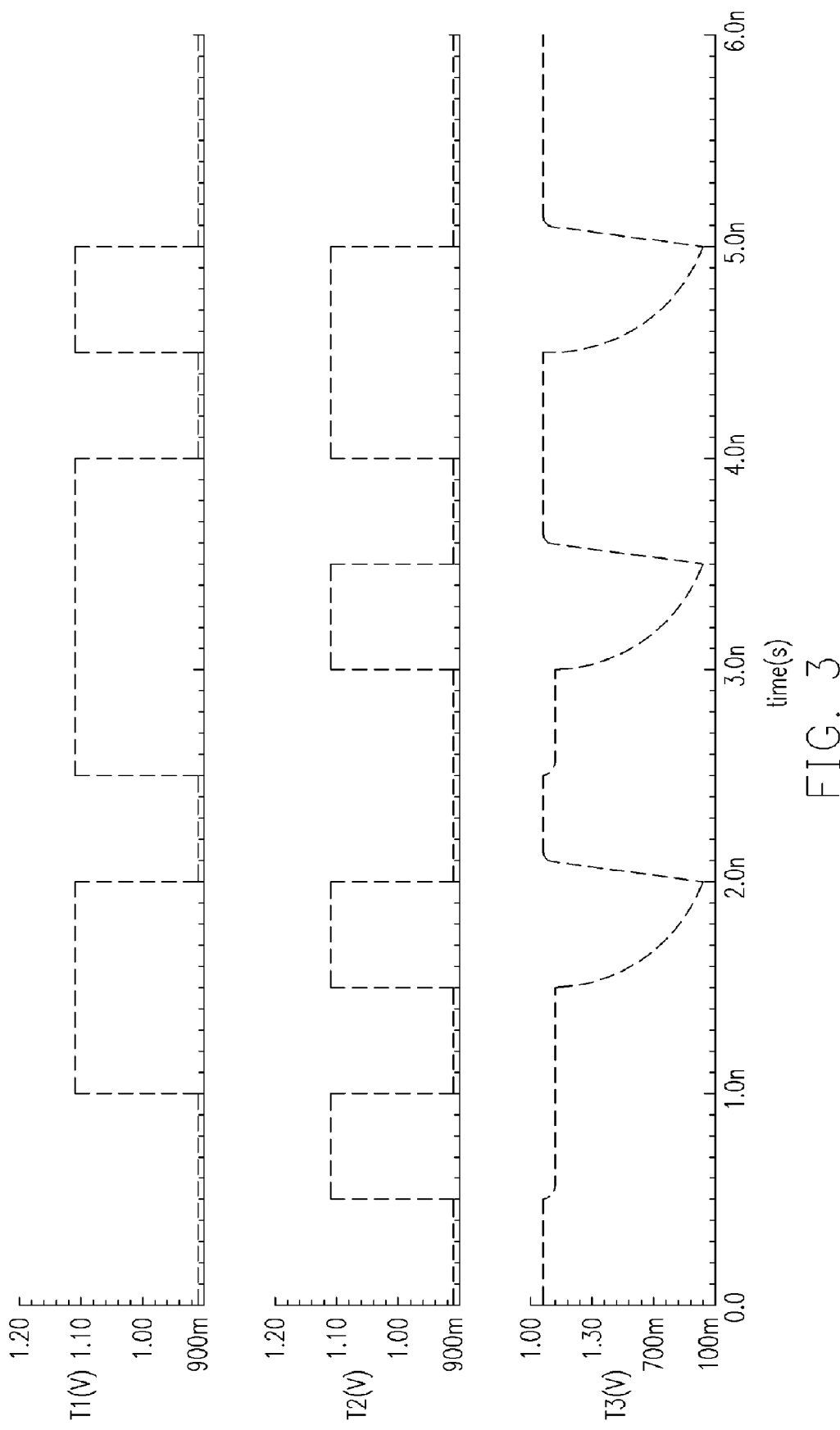
FIG. 3 schematically shows a circuit simulation result of a high frequency NAND gate according to a preferred embodiment of the present invention.

FIG. 3 schematically shows a simulation result of FIG. 2. Referring to FIGS. 2 and 3, wherein in FIG. 3, T1 is a wave vs. time diagram of input VI1, T2 is a wave vs. time diagram of input VI2, and T3 is a wave vs. time diagram of output Vout. As shown in the diagram, the amplitude of the input voltage in both T1 and T2 is 200 mV (it is equal to the specification of LVDS input), the DC level is 1V, and the frequency is 2 GHz. It is apparent that when both inputs VI1 and VI2 are 1.1V (meanwhile, the input is equal to logic 1), the output Vout is reduced to 100 mV (meanwhile, the output is equal to logic 0). When one of the inputs VI1 and VI2 is 900 mV and the other one is 1.1V, the output Vout is back to 1.8V (meanwhile, the output is equal to logic 1). It has been confirmed from FIG. 3 that even when the input signal is in such high frequency and the signal amplitude is so weak, the logic gate is still under normal operation.

Figure 4:
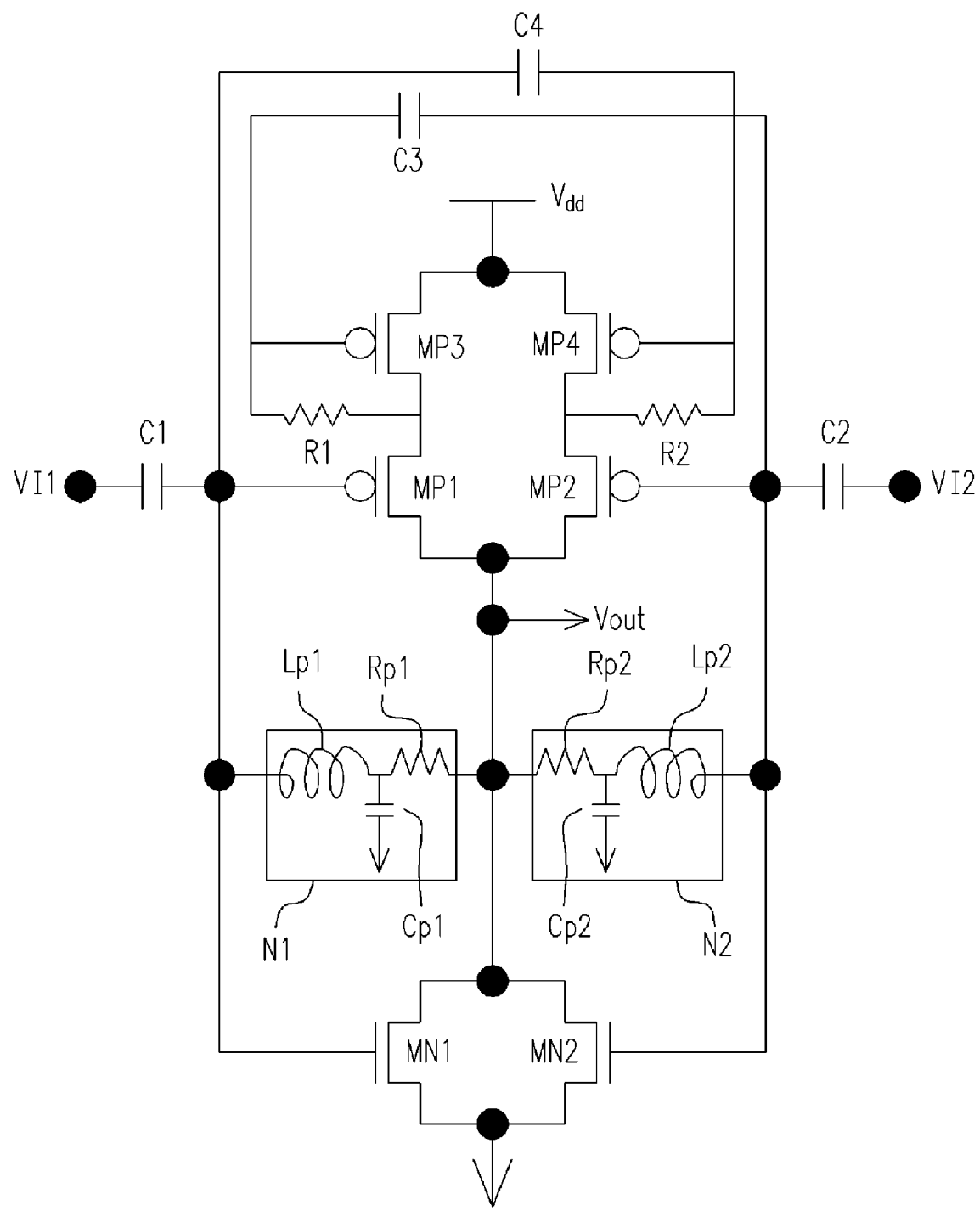
FIG. 4 schematically shows a circuit diagram of a high frequency NOR gate according to a preferred embodiment of the present invention.

FIG. 4 schematically shows a high frequency NOR gate for using in the RF band with very weak signals according to another preferred embodiment of the present invention. Referring to FIG. 4, the NOR gate comprises a first input terminal VI1, a second input terminal VI2, and an output terminal Vout for performing an NOR Boolean operation on the high frequency input signals and outputting an operation result. The NOR gate further comprises P type MOSFETs MP1, MP2, MP3, and MP4, N type MOSFETs MN1 and MN2, the capacitors C1, C2, C3, and C4, the resistors R1 and R2, and the impedance matching networks N1 and N2. Wherein, the impedance matching network N1 comprises a matching inductance element Lp1, a matching capacitance element Cp1 and a matching resistance element Rp1. The first terminal of the matching inductance element Lp1 is the first terminal of the impedance matching network N1. The first terminal of the matching capacitance element Cp1 is electrically coupled to the second terminal of the matching inductance element Lp1, and its second terminal is grounded. The first terminal of the matching resistance element Rp1 is electrically coupled to the second terminal of the inductance element Lp1, and its second terminal is electrically coupled to the second terminal of the impedance matching network N1. Similarly, the impedance matching network N2 comprises a matching inductance element Lp2, a matching capacitance element Cp2, and a matching resistance element Rp2. The first terminal of the matching inductance element Lp2 is the first terminal of the impedance matching network N2. The first terminal of the matching capacitance element Cp2 is electrically coupled to the second terminal of the matching inductance element Lp2, and its second terminal is grounded. The first terminal of the matching resistance element Rp2 is electrically coupled to the second terminal of the inductance element Lp2, and its second terminal is electrically coupled to the second terminal of the impedance matching network N2. It will be apparent to one of the ordinary skill in the art that the positions of the matching inductance element Lp1 and the matching resistance element Rp1 may be swapped with each other. Similarly, the positions of the matching inductance element Lp2 and the matching resistance element Rp2 may be swapped with each other, too.

The first terminal of the capacitor C1 is the first input terminal VI1, and the first terminal of the capacitor C2 is the second input terminal VI2. The gate of the transistor MP1 is electrically coupled to the second terminal of the capacitor C1, and the drain of the transistor MP1 is electrically coupled to the output terminal Vout. The gate of the transistor MP2 is electrically coupled to the second terminal of the capacitor C2, and the drain of the transistor MP2 is electrically coupled to the output terminal Vout. The gate of the transistor MP3 is electrically coupled to the second terminal of the capacitor C4, the source of the transistor MP3 is electrically coupled to the voltage source Vdd, and the drain of the transistor MP3 is electrically coupled to the source of the transistor MP1. The first terminal of the capacitor C4 is electrically coupled to the second terminal of the capacitor C2. The gate of the transistor MP4 is electrically coupled to the second terminal of the capacitor C3, the source of the transistor MP4 is electrically coupled to the voltage source Vdd, and the drain of the transistor MP4 is electrically coupled to the source of the transistor MP2. The first terminal of the capacitor C3 is electrically coupled to the second terminal of the capacitor C1. The first terminal of the resistor R1 is electrically coupled to the drain of the transistor MP3, and its second terminal is electrically coupled to the gate of the transistor MP3. The first terminal of the resistor R2 is electrically coupled to the drain of the transistor MP4, and its second terminal is electrically coupled to the gate of the transistor MP4. The source of the transistor MN1 is grounded, the gate of the transistor MN1 is electrically coupled to the second terminal of the capacitor C1, and the drain of the transistor MN1 is electrically coupled to the output terminal Vout. The source of the transistor MN2 is electrically grounded and its gate is electrically coupled to the second terminal of the capacitor C2, the drain of the transistor MN2 is electrically coupled to the output terminal Vout. The first terminal of the impedance matching network N1 is electrically coupled to the second terminal of the capacitor C1, and its second terminal is electrically coupled to the output terminal Vout. The first terminal of the impedance matching network N2 is electrically coupled to the second terminal of the capacitor C2, and its second terminal is electrically coupled to the output terminal Vout.

The main function of the capacitors C1 and C2 is to eliminate the DC component in the input signals VI1 and VI2. Since the DC component in the input signals has been blocked, a DC-bias is required in order to normally supply the input signals. The main function of the impedance matching networks N1 and N2 is to guide the DC-bias from the transistors MP1, MP2, MP3, and MP4 to the output terminal, wherein the DC component of the input signal has been blocked, through the impedance matching networks N1 and N2, and the input signal terminals are the second terminals of the capacitors C1 and C2. This is the so-called self supplied DC-bias, and is also known as self DC-bias or self bias. Since transistors MP1 and MP2 are on the low side of the transistors MP3 and MP4, the DC-bias for driving the gate of the transistors MP3 and MP4 is different from the DC-bias for driving the gate of the transistors MP1 and MP2. Therefore, the DC-bias originally provided to the transistors MP1 and MP2 is blocked by the capacitors C3 and C4, and a new DC-bias is provided to the gate of the transistors MN3 and MN4 through a path constituted by the resistors R1 and R2, respectively. When the impedance matching networks N1 and N2 are used as a DC-bias path, since their both terminals are electrically coupled to the input terminals VI1, VI2 and the output terminal Vout respectively, the output terminal may be impacted by the input terminal signal, and/or the input terminal may be impacted by the output terminal signal. Therefore, the circuit of the impedance matching networks N1 and N2 is configured as an LRC (Inductance-Resistance-Capacitance) low pass network, such that the input high frequency is blocked by the impedance matching networks N1 and N2 and cannot impact the output Vout. In addition, the output Vout is also blocked by the impedance matching networks N1 and N2, thus the inputs VI1 and VI2 are not impacted by it. Furthermore, since this configuration is operated in high frequency, the signal is usually very weak. As a result, the signal may be reflected and attenuated, and is not able to be transmitted with full-power. With the impedance matching networks N1 and N2, the impedance is matching to each other, and thus the signal can be input with full-power transfer.

Referring to FIG. 4, here the P type MOSFETs MP1, MP2, MP3, and MP4 and the N type MOSFETs MN1 and MN2 are not served as a switch. Instead, they work as a differential amplifier. When the signals of logic 0 are fed into the inputs VI1 and VI2, respectively (here the signal is weak and roughly equal to the amplitude of LVDS logic level), meanwhile since the transistors MN1 and MN2 have received the signals of logic 0, the voltages Vgs between the gate and the source of the transistors MN1 and MN2 are reduced, and the pulled down current from the output Vout is also reduced. Meanwhile, the transistors MP1 and MP4 have received the signals of logic 0 (the signal is weak and roughly equal to the amplitude of LVDS logic level), since the voltages Vgs between the gate and the source of the transistors MP1 and MP4 are increased, the turn-on scales for the transistors MP1 and MP4 are also increased. Similarly, the transistors MP2 and MP3 have received the signals of logic 0 (the signal is weak and roughly equal to the amplitude of LVDS logic level). Meanwhile, since the voltages Vgs between the gate and the source of the transistors MP2 and MP3 have been increased, the turn-on scales for the transistors MP2 and MP3 are increased. On the other hand, since the turn-on scales for the transistors MN1 and MN2 have been reduced, the pulled down current is reduced, and the turn-on scale for the transistors MP1, MP2, MP3, and MP4 are also increased, which pulls up Vout to the level of logic 1.

Similarly, when the input VI1 is logic 1, and the input VI2 is logic 0 (the signal is weak and roughly equal to the amplitude of LVDS logic level), meanwhile the transistor MN1 has received a signal of logic 1, such that the voltages Vgs between the gate and the source of the transistor MN1 are reduced, and the current pulled down by the transistor MN1 to the ground is reduced. However, the transistor MN2 has received a signal of logic 0, such that the voltage Vgs between the gate and the source of the transistor MN2 is increased, and the current pulled down by the transistor MP2 to the ground is increased. The transistors MP1 and MP4 have received the signals of logic 1, such that the voltages Vgs between the gate and the source of the transistors MP1 and MP4 are reduced, and the turn-on scales for the transistors MP1 and MP4 are also increased. Since the transistors MP2 and MP3 have received the signals of logic 0, the voltages Vgs between the gate and the source of the transistors MN2 and MN3 are increased, and the turn-on scales for the transistors MN2 and MN3 are reduced. On the other hand, since the turn-on scale for the transistor MN1 has been reduced, the turn-on scale for the transistor MN2 is increased, such that the current pulled down to the ground is not changed. In addition, the turn-on scales for the transistors MP1 and MP4 have been reduced, and the turn-on scales for the transistors MP2 and MP3 have been increased, such that the capability of providing the current from the voltage source Vdd is reduced. Therefore, the output Vout is pulled down to a level of logic 0. Alternatively, in a case where the input VI1 is logic 0, and the input VI2 is logic 1, the role play of transistors MP2 and MP3 is swapped with the transistors MP1 and MP4, and the role play of the transistor MN1 is swapped with the transistor MN2. The operation mode of such case is the same as the one mentioned above, and the result is the same, thus its detail is omitted herein.

In addition, when both the inputs VI1 and VI2 are in the logic 1 weak potential, meanwhile, since the voltages Vgs between the gate and the source of the transistors MP1, MP2, MP3, and MP4 are reduced, the pulled up current provided by the voltage source Vdd is reduced. Whereas, the voltages Vgs between the gate and the source of the transistors MN1 and MN2 are increased, such that the capability of providing the pulled down current by the transistors MN1 and MN2 is increased, and the output is pulled down to logic 0.

Referring to FIG. 4, when there is no signal fed into the input terminals VI1 and VI2, a DC-bias provided by the voltage source Vdd flowing through the transistors MP1, MP2, MP3, and MP4 is fed into the transistors MN1 and MP1 via the impedance matching circuit N1. Similarly, a DC-bias is provided to the transistors MN2 and MP2 through the impedance matching network N2, and the DC-bias received by the transistors MP2 and MP1 reduces the voltage Vgs, thus the supplied DC-bias is also reduced and the DC current flowing to the ground is reduced. With such configuration, the static power consumption is reduced when the logic gate is idle.

Figure 5:
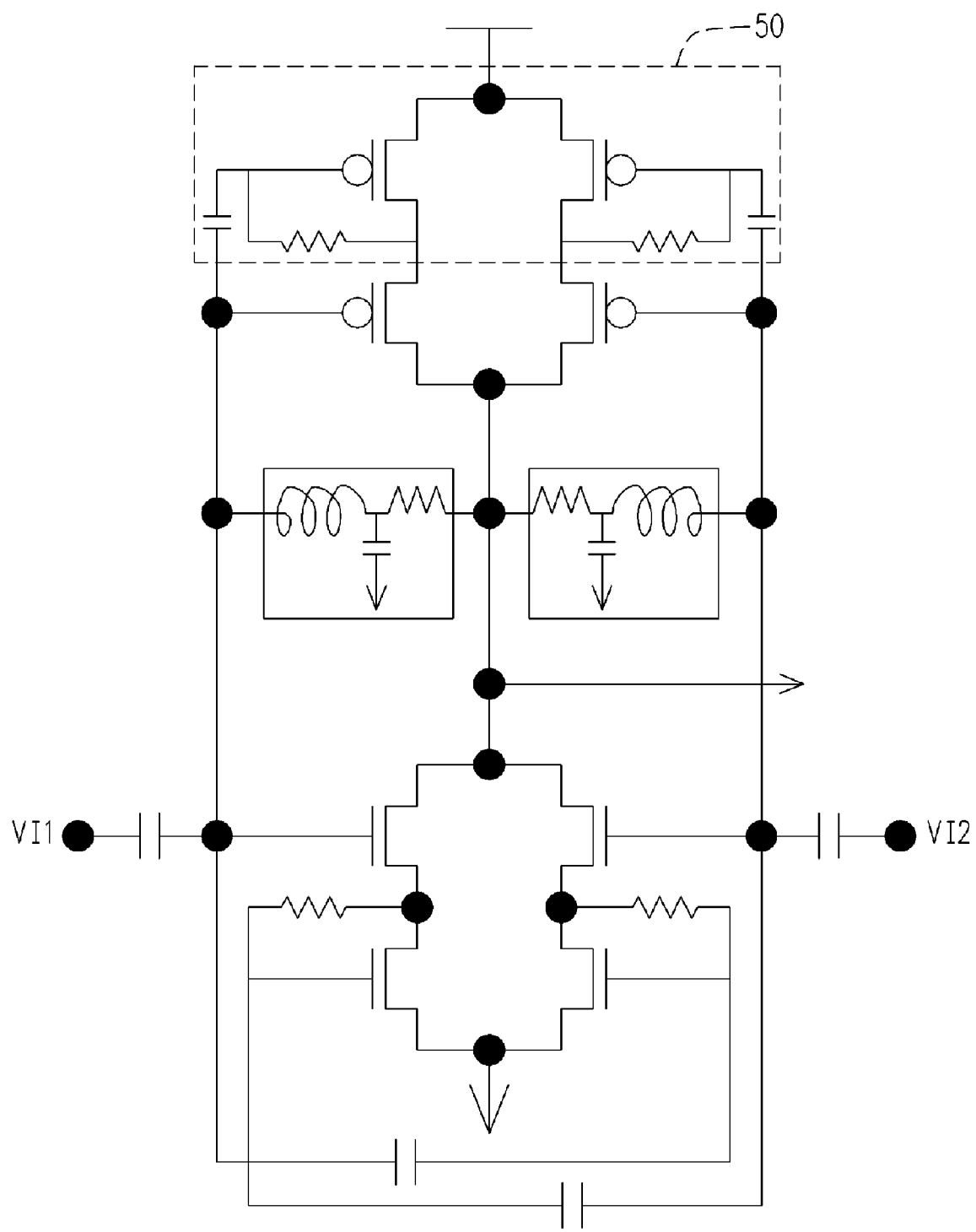
FIG. 5 schematically shows a circuit diagram of a high frequency NAND gate according to a preferred embodiment of the present invention.
Figure 6:
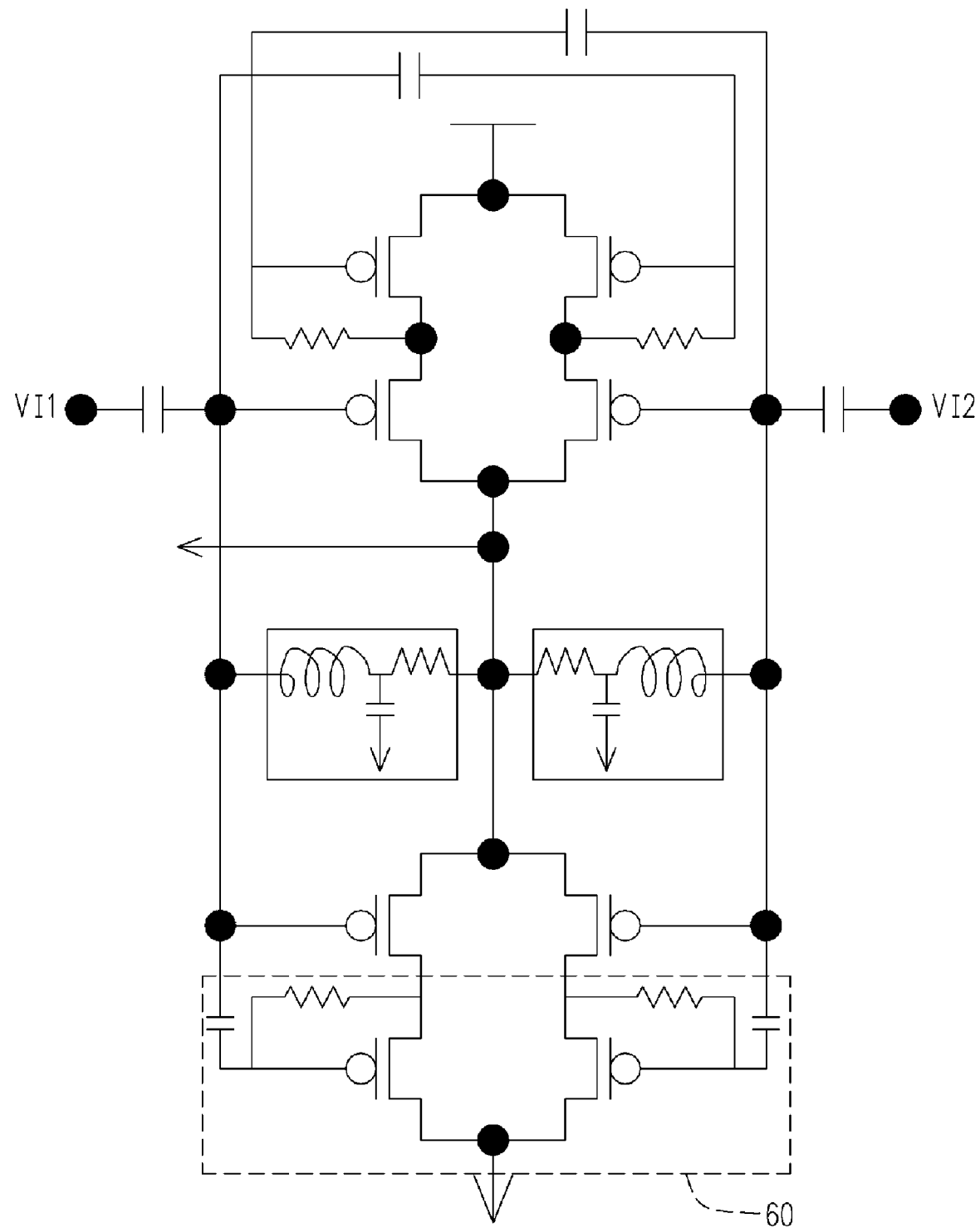
FIG. 6 schematically shows a circuit diagram of a high frequency AND gate according to a preferred embodiment of the present invention.

FIG. 5 schematically shows a circuit diagram of a high frequency NAND gate according to a preferred embodiment of the present invention. FIG. 6 schematically shows a circuit diagram of a high frequency AND gate according to another preferred embodiment of the present invention. Wherein, compared to FIG. 2, in a circuit 50, two P type transistors, two resistors for providing the DC-bias for the P type transistors, and two capacitors for isolating the DC-bias are further comprised in FIG. 5. It will be apparent to one of the ordinary skill in the art that the operation of FIG. 5 is same as the operation of FIG. 2, thus its detail is omitted here. Compared to FIG. 4, in a circuit 60, two N type transistors, two resistors for providing the DC-bias for the N type transistors, and two capacitors for isolating the DC-bias are further comprised in FIG. 6. It will be apparent to one of the ordinary skill in the art that the operation of FIG. 6 is same as the high frequency NOR gate in FIG. 4. However, if the signal is inversed and input into the inputs VI1 and VI2, an AND operation result is obtained, thus this description of the operation is omitted herein.

As shown in the preferred embodiments in FIGS. 2, 4, 5, and 6, it is apparent that the "self DC-bias high frequency logic gate" provided by the present invention is characterized in that each transistor is electrically coupled to an impedance matching network. Wherein, the impedance matching network comprises a first terminal and a second terminal. The first terminal of the impedance matching network is electrically coupled to the gate of the transistor, and its second terminal is electrically coupled to the drain of the transistor for providing an operation voltage to the transistor. In addition, when a gate of an N type transistor and a gate of a P type transistor are electrically coupled with each other, and a drain of the N type transistor and a drain of the P type transistor are also electrically coupled with each other, a common impedance matching network is shared with both the N type transistor and the P type transistor for providing a self DC-bias. Accordingly, the input impedance matching is achieved, and thus the signal can be input to the input terminals with full-power transfer. In addition, the logic gate can operate functionally in the RF band with weak signal (e.g. the logic input of LVDS level).

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A self DC-bias high frequency logic gate comprising at least an input terminal and an output terminal for performing a Boolean operation on the high frequency input signals and outputting an operation result, and the logic gate is characterized in:
wherein, each transistor is electrically coupled to an impedance matching network, and the impedance matching network comprises a first terminal and a second terminal, a matching inductance element, a matching capacitance element, and a matching resistance element, the matching inductance element and the matching resistance element are connected in series between the first and second terminals, the matching capacitance element has a first terminal connected to a connection point of the matching inductance element and the matching resistance element, and a second terminal connected to a ground, the first terminal of the impedance matching network is electrically coupled to a gate of the transistor, the second terminal of the impedance matching network is electrically coupled to a drain of the transistor for providing an operation voltage to the transistor.

2. The self DC-bias high frequency logic gate of claim 1, wherein the impedance matching network is a low pass network for preventing the high frequency signals between the gate and the drain of the transistor from interfering with each other, and the DC-bias is normally provided.

3. The self DC-bias high frequency logic gate of claim 2, wherein
the first terminal of the matching inductance element is the first terminal of the impedance matching network;
the first terminal of the matching capacitance element is electrically coupled to a second terminal of the matching inductance element; and
a first terminal of the matching resistance element is electrically coupled to the second terminal of the matching inductance element, and a second terminal of the matching resistance element is the second terminal of the impedance matching network.

4. The self DC-bias high frequency logic gate of claim 2, wherein
the first terminal of the matching resistance element is the first terminal of the impedance matching network;
the first terminal of the matching capacitance element is electrically coupled to a second terminal of the matching resistance element; and
a first terminal of the matching inductance element is electrically coupled to the second terminal of the matching resistance element, and a second terminal of the matching inductance element is electrically coupled to the second terminal of the impedance matching network.

5. The self DC-bias high frequency logic gate of claim 1, wherein when a gate of an N type transistor and a gate of a P type transistor are electrically coupled with each other, and a drain of the N type transistor and a drain of the P type transistor are electrically coupled with each other, the common impedance matching network is shared with both the N type transistor and the P type transistor.

6. The self DC-bias high frequency logic gate of claim 1, wherein the logic gate is operated in an RF band with very weak signals.

7. A high frequency NAND gate comprising a first input terminal, a second input terminal, and an output terminal for performing an NAND Boolean operation on the high frequency input signals and outputting an operation result, the NAND gate comprising:
a first capacitor, wherein a first terminal of the first capacitor is electrically coupled to the first input terminal for isolating a DC component in a signal input into the first input terminal;
a second capacitor, wherein a first terminal of the second capacitor is electrically coupled to the second input terminal for isolating a DC component in a signal input into the second input terminal;
a first transistor, wherein a gate of the first transistor is electrically coupled to a second terminal of the first capacitor, and a drain of the first transistor is electrically coupled to the output terminal;
a second transistor, wherein a gate of the second transistor is electrically coupled to a second terminal of the second capacitor, and a drain of the second transistor is electrically coupled to the output terminal;
a third capacitor, wherein a first terminal of the third capacitor is electrically coupled to the gate of the first transistor;
a fourth capacitor, wherein a first terminal of the fourth capacitor is electrically coupled to the gate of the second transistor;
a third transistor, wherein a gate of the third transistor is electrically coupled to a second terminal of the fourth capacitor, a source of the third transistor is grounded, and a drain of the third transistor is electrically coupled to a source of the first transistor;
a fourth transistor, wherein a gate of the fourth transistor is electrically coupled to a second terminal of the third capacitor, a source of the fourth transistor is grounded, and a drain of the fourth transistor is electrically coupled to a source of the second transistor;
a fifth transistor, wherein a source of the fifth transistor is electrically coupled to a voltage source, a gate of the fifth transistor is electrically coupled to the second terminal of the first capacitor, and a drain of the fifth transistor is electrically coupled to the output terminal;
a sixth transistor, wherein a source of the sixth transistor is electrically coupled to the voltage source, a gate of the sixth transistor is electrically coupled to the second terminal of the second capacitor, and a drain of the sixth transistor is electrically coupled to the output terminal;
a first impedance matching network, comprising a first terminal and a second terminal, wherein the first terminal is electrically coupled to a second terminal of the first capacitor, and the second terminal is electrically coupled to the output terminal for providing an operation voltage to the first transistor and the fifth transistor;
a second impedance matching network, comprising a first terminal and a second terminal, wherein the first terminal is electrically coupled to a second terminal of the second capacitor, and the second terminal is electrically coupled to the output terminal for providing an operation voltage to the second transistor and the sixth transistor;
a third impedance matching network, comprising a first terminal and a second terminal, wherein the first terminal is electrically coupled to the drain of the third transistor, and the second terminal is electrically coupled to the gate of the third transistor for providing an operation voltage to the third transistor; and
a fourth impedance matching network, comprising a first terminal and a second terminal, wherein the first terminal is electrically coupled to the drain of the fourth transistor, and the second terminal is electrically coupled to the gate of the fourth transistor for providing an operation voltage to the fourth transistor.

8. The high frequency NAND gate of claim 7, wherein the first, the second, the third, and the fourth transistors are N type MOSFET, and the fifth and the sixth transistors are P type MOSFET.

9. The high frequency NAND gate of claim 7, wherein each of the first impedance matching network and the second impedance matching network is a low pass network for preventing the high frequency signals between the gate and the drain of the transistor from interfering with each other, and the DC-bias is normally provided.

10. The high frequency NAND gate of claim 9, wherein the first impedance matching network has the same configuration as the second impedance matching network, and the first impedance matching network comprises:
 a matching inductance element, wherein a first terminal of the matching inductance element is the first terminal of the first impedance matching network;
 a matching capacitance element, wherein a first terminal of the matching capacitance element is electrically coupled to a second terminal of the matching inductance element, and a second terminal of the matching capacitance element is grounded; and
 a matching resistance element, wherein a first terminal of the matching resistance element is electrically coupled to a second terminal of the matching inductance element, and a second terminal of the matching resistance element is electrically coupled to the second terminal of the first impedance matching network.

11. The high frequency NAND gate of claim 9, wherein the first impedance matching network has the same configuration as the second impedance matching network, and the first impedance matching network comprises:
 a matching resistance element, wherein a first terminal of the matching resistance element is electrically coupled to the first terminal of the first impedance matching network;
 a matching capacitance element, wherein a first terminal of the matching capacitance element is electrically coupled to a second terminal of the matching resistance element, and a second terminal of the matching capacitance element is grounded; and
 a matching inductance element, wherein a first terminal of the matching inductance element is electrically coupled to a second terminal of the matching resistance element, and a second terminal of the matching inductance element is electrically coupled to the second terminal of the first impedance matching network.

12. The high frequency NAND gate of claim 7, wherein the third impedance matching network has the same configuration as the fourth impedance matching network, and the third impedance matching network is a high impedance resistor.

13. The high frequency NAND gate of claim 7, wherein the NAND gate is operated in an RF band with very weak signals.

14. A high frequency NOR gate comprising a first input terminal, a second input terminal, and an output terminal for performing an NOR Boolean operation on the high frequency input signals and outputting an operation result, the NOR gate comprising:
 a first capacitor, wherein a first terminal of the first capacitor is electrically coupled to the first input terminal for isolating a DC component in a signal input into the first input terminal;
 a second capacitor, wherein a first terminal of the second capacitor is electrically coupled to the second input terminal for isolating a DC component in a signal input into the second input terminal;
 a first transistor, wherein a gate of the first transistor is electrically coupled to a second terminal of the first capacitor, and a drain of the first transistor is electrically coupled to the output terminal;
 a second transistor, wherein a gate of the second transistor is electrically coupled to a second terminal of the second capacitor, and a drain of the second transistor is electrically coupled to the output terminal;
 a third capacitor, wherein a first terminal of the third capacitor is electrically coupled to the gate of the first transistor;
 a fourth capacitor, wherein a first terminal of the fourth capacitor is electrically coupled to the gate of the second transistor;
 a third transistor, wherein a gate of the third transistor is electrically coupled to a second terminal of the fourth capacitor, a source of the third transistor is electrically coupled to a voltage source, and a drain of the third transistor is electrically coupled to a source of the first transistor;
 a fourth transistor, wherein a gate of the fourth transistor is electrically coupled to a second terminal of the third capacitor, a source of the fourth transistor is electrically coupled to the voltage source, and a drain of the fourth transistor is electrically coupled to a source of the second transistor;
 a fifth transistor, wherein a source of the fifth transistor is grounded, a gate of the fifth transistor is electrically coupled to the second terminal of the first capacitor, and a drain of the fifth transistor is electrically coupled to the output terminal;
 a sixth transistor, wherein a source of the sixth transistor is grounded, a gate of the sixth transistor is electrically coupled to the second terminal of the second capacitor, and a drain of the sixth transistor is electrically coupled to the output terminal;
 a first impedance matching network, comprising a first terminal and a second terminal, wherein the first terminal is electrically coupled to a second terminal of the first capacitor, and the second terminal is electrically coupled to the output terminal for providing an operation voltage to the first transistor and the fifth transistor;
 a second impedance matching network, comprising a first terminal and a second terminal, wherein the first terminal is electrically coupled to a second terminal of the second capacitor, and the second terminal is electrically coupled to the output terminal for providing an operation voltage to the second transistor and the sixth transistor;
 a third impedance matching network, comprising a first terminal and a second terminal, wherein the first terminal is electrically coupled to the drain of the third transistor, and the second terminal is electrically coupled to the gate of the third transistor for providing an operation voltage to the third transistor; and
 a fourth impedance matching network, comprising a first terminal and a second terminal, wherein the first terminal is electrically coupled to the drain of the fourth transistor, and the second terminal is electrically coupled to the gate of the fourth transistor for providing an operation voltage to the fourth transistor.

15. The high frequency NOR gate of claim 14, wherein the first, the second, the third, and the fourth transistors are P type MOSFET, and the fifth and the sixth transistors are N type MOSFET.

16. The high frequency NOR gate of claim 14, wherein both each of the first impedance matching network and the second impedance matching network is a low pass network for preventing the high frequency signals between the gate and the drain of the transistor from interfering with each other, and the DC-bias is normally provided.

17. The high frequency NOR gate of claim 16, wherein the first impedance matching network has the same configuration as the second impedance matching network, and the first impedance matching network comprises:
- a matching inductance element, wherein a first terminal of the matching inductance element is the first terminal of the first impedance matching network;
- a matching capacitance element, wherein a first terminal of the matching capacitance element is electrically coupled to a second terminal of the matching inductance element, and a second terminal of the matching capacitance element is grounded; and
- a matching resistance element, wherein a first terminal of the matching resistance element is electrically coupled to second terminal of the matching inductance element, and a second terminal of the matching resistance element is electrically coupled to the second terminal of the first impedance matching network.

18. The high frequency NOR gate of claim 16, wherein the first impedance matching network has the same configuration as the second impedance matching network, and the first impedance matching network comprises:
- a matching resistance element, wherein a first terminal of the matching resistance element is electrically coupled to the first terminal of the first impedance matching network;
- a matching capacitance element, wherein a first terminal of the matching capacitance element is electrically coupled to a second terminal of the matching resistance element, and a second terminal of the matching capacitance element is grounded; and
- a matching inductance element, wherein a first terminal of the matching inductance element is electrically coupled to second terminal of the matching resistance element, and a second terminal of the matching inductance element is electrically coupled to the second terminal of the first impedance matching network.

19. The high frequency NOR gate of claim 14, wherein the third impedance matching network has the same configuration as the fourth impedance matching network, and the third impedance matching network is a high impedance resistor.

20. The high frequency NOR gate of claim 14, wherein the NAND gate is operated in an RF band with very weak signals.

* * * * *